US010732512B2

(12) United States Patent
Sutani et al.

(10) Patent No.: US 10,732,512 B2
(45) Date of Patent: Aug. 4, 2020

(54) IMAGE PROCESSOR, METHOD FOR GENERATING PATTERN USING SELF-ORGANIZING LITHOGRAPHIC TECHNIQUES AND COMPUTER PROGRAM

(71) Applicant: Hitachi High-Technologies Corporation, Minato-ku, Tokyo (JP)

(72) Inventors: Takumichi Sutani, Tokyo (JP); Miki Isawa, Tokyo (JP); Shunsuke Koshihara, Tokyo (JP); Akiyuki Sugiyama, Tokyo (JP)

(73) Assignee: Hitachi High-Tech Corporation, Tokyo (JP)

(*) Notice: Subject to any disclaimer, the term of this patent is extended or adjusted under 35 U.S.C. 154(b) by 35 days.

(21) Appl. No.: 15/903,536

(22) Filed: Feb. 23, 2018

(65) Prior Publication Data

US 2018/0181009 A1 Jun. 28, 2018

Related U.S. Application Data

(63) Continuation of application No. 14/441,768, filed as application No. PCT/JP2013/080753 on Nov. 14, 2013, now abandoned.

(30) Foreign Application Priority Data

Nov. 16, 2012 (JP) ................................. 2012-251770

(51) Int. Cl.
*G06K 9/00* (2006.01)
*G03F 7/20* (2006.01)
(Continued)

(52) U.S. Cl.
CPC .......... *G03F 7/70491* (2013.01); *B82Y 40/00* (2013.01); *H01L 21/0337* (2013.01)

(58) Field of Classification Search
None
See application file for complete search history.

(56) References Cited

U.S. PATENT DOCUMENTS 6,066,578 A * 5/2000 Gupta ................... G03F 7/16
438/790
6,627,888 B2 * 9/2003 Yamaguchi .......... G01N 23/225
850/5
(Continued)

FOREIGN PATENT DOCUMENTS

CN 102428022 A 4/2012
CN 102540702 A 7/2012
(Continued)

OTHER PUBLICATIONS

Fabrication of templates—lithography, Lei Wan et al.,MEMS MOEMS 11(3). 031405, Jul.-Sep. 2012, pp. 031405-1-031405-5 (Year: 2012).*

(Continued)

*Primary Examiner* — Jayesh A Patel
(74) *Attorney, Agent, or Firm* — Crowell & Moring LLP

(57) ABSTRACT

An image processor, a method for generating a pattern using self-organizing lithographic techniques, and a computer program are provided to achieve image processing suitable for addressing a sample generated by patterning using Directed Self-Assembly (DSA), and the processor, method, and computer program are characterized in that a template for addressing is prepared on the basis of guide pattern data used for patterning by DSA. The above configuration makes it possible to provide an addressing pattern suitable for visual field positioning in measuring or inspecting a pattern formed through the patterning process using DSA.

2 Claims, 10 Drawing Sheets

(51) Int. Cl.
*B82Y 40/00* (2011.01)
*H01L 21/033* (2006.01)

(56) References Cited

U.S. PATENT DOCUMENTS

| | | | | |
|---|---|---|---|---|
| 6,746,825 | B2* | 6/2004 | Nealey | B82Y 30/00 369/100 |
| 7,521,090 | B1* | 4/2009 | Cheng | B05D 5/00 427/256 |
| 7,521,094 | B1* | 4/2009 | Cheng | B82Y 10/00 427/385.5 |
| 7,545,977 | B2 | 6/2009 | Ikeda et al. | |
| 7,889,909 | B2* | 2/2011 | Shindo | G06K 9/2036 250/492.22 |
| 7,901,607 | B2* | 3/2011 | Xu | B82Y 10/00 264/139 |
| 8,010,913 | B2* | 8/2011 | Poonawala | G06F 30/398 716/50 |
| 8,114,306 | B2* | 2/2012 | Cheng | B81C 1/00031 216/17 |
| 8,338,804 | B2* | 12/2012 | Morokuma | G01B 15/04 250/306 |
| 8,623,493 | B2* | 1/2014 | Nealey | B01D 69/10 427/256 |
| 8,774,493 | B2 | 7/2014 | Yang et al. | |
| 8,885,950 | B2* | 11/2014 | Nagatomo | G06K 9/6203 382/181 |
| 9,183,870 | B2* | 11/2015 | Nealey | G11B 5/855 |
| 9,298,870 | B1* | 3/2016 | Cheng | G06F 30/39 |
| 9,372,398 | B2* | 6/2016 | Nealey | B81C 1/00031 |
| 9,488,815 | B2* | 11/2016 | Miyamoto | G02B 21/008 |
| 10,538,859 | B2* | 1/2020 | Peeters | C30B 19/12 |
| 2003/0091752 | A1 | 5/2003 | Nealey et al. | |
| 2004/0081350 | A1 | 4/2004 | Kitamura et al. | |
| 2005/0226494 | A1 | 10/2005 | Yamamoto et al. | |
| 2005/0285035 | A1 | 12/2005 | Mizuno et al. | |
| 2006/0126916 | A1 | 6/2006 | Kokumai | |
| 2006/0284081 | A1* | 12/2006 | Miyamoto | H01J 37/21 250/307 |
| 2008/0299353 | A1* | 12/2008 | Stoykovich | B82Y 30/00 428/195.1 |
| 2009/0087653 | A1* | 4/2009 | Nealey | B32B 3/00 428/339 |
| 2009/0110264 | A1* | 4/2009 | Hayashi | G06K 9/3216 382/151 |
| 2009/0179002 | A1* | 7/2009 | Cheng | B82Y 10/00 216/41 |
| 2009/0214703 | A1 | 8/2009 | Nielsen et al. | |
| 2009/0308837 | A1 | 12/2009 | Albrecht et al. | |
| 2010/0167214 | A1* | 7/2010 | Yoon | B82Y 40/00 430/323 |
| 2010/0203430 | A1* | 8/2010 | Ye | G03F 7/70433 430/5 |
| 2010/0294740 | A1* | 11/2010 | Cheng | H01L 21/31144 216/18 |
| 2010/0297847 | A1 | 11/2010 | Cheng et al. | |
| 2011/0033786 | A1 | 2/2011 | Sandhu | |
| 2011/0147983 | A1* | 6/2011 | Cheng | G03F 7/40 264/220 |
| 2011/0147984 | A1* | 6/2011 | Cheng | B82Y 10/00 264/220 |
| 2011/0200795 | A1* | 8/2011 | Lammers | B82Y 40/00 428/195.1 |
| 2012/0048783 | A1* | 3/2012 | Painter | C10G 1/045 208/390 |
| 2012/0106826 | A1* | 5/2012 | Toyoda | G01B 15/04 382/145 |
| 2012/0121160 | A1 | 5/2012 | Matsuoka et al. | |
| 2012/0135159 | A1 | 5/2012 | Xiao et al. | |
| 2012/0164392 | A1* | 6/2012 | Stoykovich | B41M 5/5218 428/172 |
| 2012/0202017 | A1* | 8/2012 | Nealey | G11B 5/82 428/195.1 |
| 2012/0207397 | A1 | 8/2012 | Nagatomo et al. | |
| 2012/0267528 | A1* | 10/2012 | Sakai | G06T 7/001 250/307 |
| 2014/0116980 | A1* | 5/2014 | Wuister | B82Y 40/00 216/11 |
| 2015/0243008 | A1* | 8/2015 | Isawa | G06K 9/52 382/144 |

FOREIGN PATENT DOCUMENTS

| | | | |
|---|---|---|---|
| JP | 6-120310 A | | 4/1994 |
| JP | 2006010522 A | * | 1/2006 |
| JP | 2006-10522 A | | 1/2009 |
| JP | 2010-269304 A | | 12/2010 |
| JP | 2010269304 A | * | 12/2010 |
| JP | 2012-527752 A | | 11/2012 |
| KR | 1020009004513 A | | 5/2009 |
| KR | 10-2010-0032397 A | | 3/2010 |

OTHER PUBLICATIONS

Rectangular patterns using block—Media, Ricardo Ruiz et al., ACSNANO, vol. 5, No. 1, 2011, pp. 79-84 (Year: 2011).*
International Search Report (PCT/ISA/210) dated Dec. 10, 2013, with English translation (four (4) pages).
Korean-language Office Action issued in counterpart Korean Application No. 10-2015-7011397 dated Mar. 2, 2016 with partial English translation (Seven (7) pages).
Chinese-language Office Action issued in counterpart Chinese Application No. 201380058529.2 dated Jul. 25, 2016 (6 pages).
Korean Office Action issued in counterpart Korean Application No. 10-2017-7006190 dated Jun. 2, 2017 with English translation (nine pages).

* cited by examiner

FIG. 14
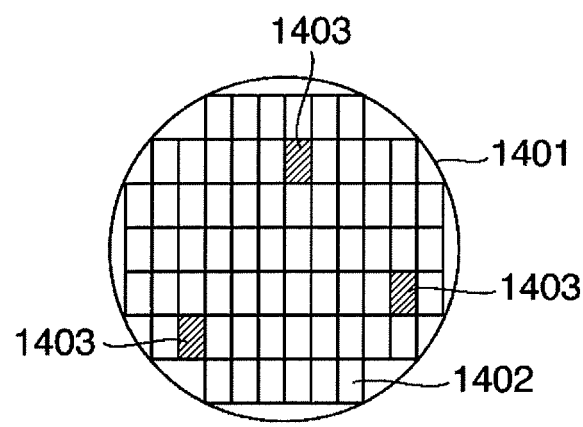
FIG. 15
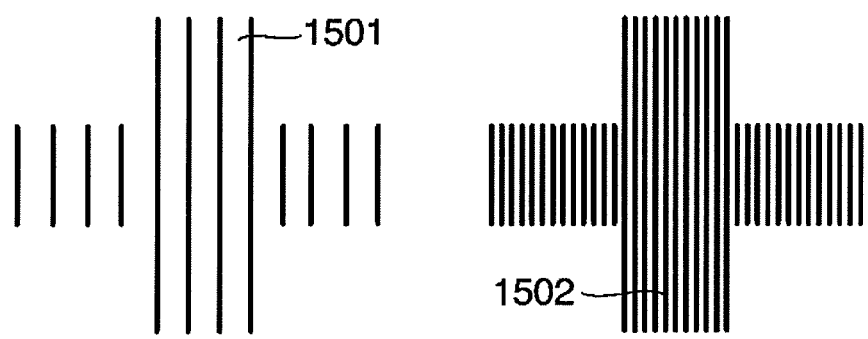
FIG. 16A    FIG. 16B
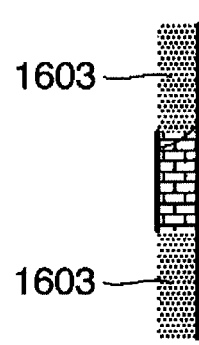    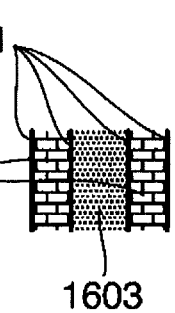

| Polymer | Pitch | Width |
|---|---|---|
| A | | |
| B | | |
| C | | |
| D | | |
| E | | |
| F | | |
| G | | |

IMAGE PROCESSOR, METHOD FOR GENERATING PATTERN USING SELF-ORGANIZING LITHOGRAPHIC TECHNIQUES AND COMPUTER PROGRAM

CROSS REFERENCE TO RELATED APPLICATIONS

This application is a continuation of U.S. application Ser. No. 14/441,768 filed May 8, 2015, which is a National Phase of PCT International Application No. PCT/JP2013/080753, filed Nov. 14, 2013, which claims priority under 35 U.S.C. § 119 from Japanese Patent Application No. 2012-251770, filed Nov. 16, 2012, the entire disclosures of which are herein expressly incorporated by reference.

TECHNICAL FIELD

The present invention relates to an image processor that processes an image obtained by a scanning electron microscope, a pattern generation method that generates a pattern required for evaluation using a scanning electron microscope, and a computer program, and more particularly to an image processor that generates addressing pattern data for identifying the position of a pattern that is an evaluation object, a pattern generation method that generates an addressing pattern, and a computer program.

BACKGROUND ART

As one of the technologies for forming a minute pattern, DSA (Directed Self-Assembly; self-organization technique) is known. This is a method for forming a minute pattern using the characteristics that a polymer is regularly organized by applying heat treatment to polymer.

Patent Literature 1 describes an example of observing a pattern, which is formed with the DSA technology, using a scanning electron microscope and an example of pattern size measurement.

CITATION LIST

Patent Literature

Patent Literature 1: JP-A-2010-269304 (corresponding U.S. Pat. No. 8,114,306)

SUMMARY OF INVENTION

Technical Problem

On the other hand, to make a pattern evaluation using a scanning electron microscope, it is required for the field of view (Field Of View: FOV) of the scanning electron microscope to be accurately positioned onto an evaluation object pattern. As a method for positioning the field of view onto a very minute evaluation object pattern, there is a method called addressing. Addressing is a method that finds a unique pattern, which is present near an evaluation object pattern, through the matching processing with the use of a pre-set template and, at the same time, performs field of view positioning onto the evaluation object pattern that has a known positional relation with the unique pattern. Patent Literature 1 does not disclose a method for performing addressing on a sample formed through the DSA technology. In the future, there will be a need for an addressing method suitable for a sample created through DSA patterning, a template creation method for addressing, or the creation of a pattern suitable for addressing.

The following describes an image processor the purpose of which is to implement image processing suitable for addressing on a sample generated through DSA patterning, a pattern generation method implemented by the self-organizing lithographic technique, and a computer program.

Solution to Problem

In one aspect for achieving the above object, the following proposes an image processor that creates a template for addressing based on guide pattern data used for DSA patterning, a pattern generation method implemented by the self-organizing lithographic technique, and a computer program.

Advantageous Effects of Invention

According to the configuration described above, an addressing pattern can be provided that is suitable for field of view positioning when a pattern, formed via the DSA patterning process, is measured or inspected.

The other objects, features, and advantages of the present invention will become apparent from the following description taken in conjunction with the accompanying drawings.

BRIEF DESCRIPTION OF DRAWINGS

FIG. 14 is a diagram showing an example of a semiconductor wafer that has a plurality of chips created under the same fabrication condition.

FIG. 15 is a diagram showing an example of addressing pattern design data and an addressing pattern created based on the design data.

FIGS. 16A and 16B are diagrams showing an example of the arrangement of a guide pattern.

DESCRIPTION OF EMBODIMENTS

Figure 1:
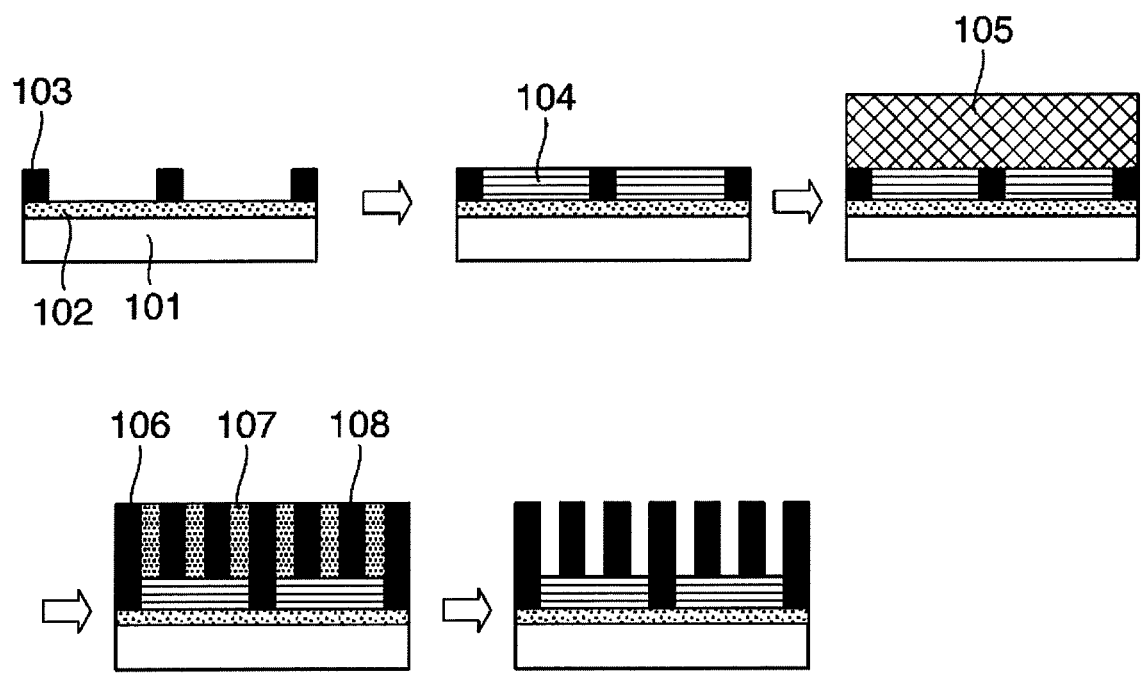
FIG. 1 is a diagram showing an example of a patterning process using the DSA technology.

DSA is a new patterning technology that uses the self-organization phenomenon of a macromolecule. The shape or the size of a pattern can be controlled by designing the molecular structure or the molecular weight of a BPC using a method that uses the microphase separation phenomenon in which a polymer block copolymer (Block C-Polymer: BCP) forms a nano-sized, regularly distributed domain. Because this method does not use a special device and facilities, the cost can be reduced. Recently, the semiconductor fabrication process using this method is under development. FIG. 1 is a diagram showing an example of a patterning process using DSA.

In the patterning shown in FIG. 1, a pattern 103 of one type of polymer A is first created on the substrate, on which SiN 102 is formed on a Si wafer 101, using the lithography process. In this example, the size of the pattern 103 is 28 nm, and the pitch to the neighboring pattern is 168 nm. Next, an intermediate layer 104 is formed between the pattern 103 of polymer A and the neighboring pattern 103, and a BCP 105 is applied on the top.

Figure 2:
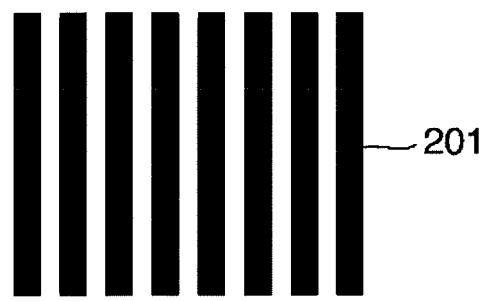
FIG. 2 is a diagram showing an example of a pattern formed via the patterning process using the DSA technology.

When heat treatment (annealing) is applied in this state, the BCP is divided into two layers, a pattern 106 (polymer A) and a pattern 107 (polymer B), and these are spaced at equal intervals each with a size of 28 nm. At this time, the pattern 106 is formed on the pattern 103 and a pattern 108 is formed on the intermediate layer 104, with both patterns made of the same material. After that, a line pattern is formed by removing the pattern 107. As described above, the patterns 106 and 108, which are target patterns, are formed along the pattern 103 that is a guide pattern. On this guide pattern, only a pattern of a unique size and a unique pitch is formed suitably. FIG. 2 shows the pattern observed from top.

To correctly evaluate the pattern formed via the process described above, it is desirable to use a CD-SEM (Critical Dimension Scanning Electron Microscope) that is suitable for pattern size measurement. When a pattern is measured using a CD-SEM, an addressing pattern for correcting the position of an object pattern is required near the object pattern.

Addressing uses a template, registered in advance as described above, to search an image, acquired with a field of view relatively larger than the field of view at measurement time, to find the matching degree between each position and the template. Addressing identifies a position, where the matching degree is highest or the matching degree satisfies a predetermined condition, as a matching position and, at the same time, allows the field of view to be moved to an evaluation object position (area including a measurement object pattern) that has a known positional relation with the matching position.

On the other hand, when the BCP is applied to, and annealing is performed for, the sample as described above, the pattern is regularly arranged in the guide pattern and, in the other part, a random pattern is generated in which there is no directional regularity. For example, an attempt to perform addressing with a random pattern remained results in a situation in which the shape matching degree between an already-registered template including a random pattern and a particular position determined by the template varies among the measuring objects and, as a result, the matching accuracy is decreased. When addressing is performed with a random pattern removed, an image is generated in which the guide pattern and the polymers selectively arranged in the guide pattern are superimposed. It is desired to create such a template that is similar to the pattern shape.

An image processor that performs pattern matching using a template including a guide pattern and a computer program are described below. In particular, the method for creating a template, which includes a guide pattern and a pattern, formed based on the alignment of polymers in the guide pattern, are described in detail.

Figure 5:
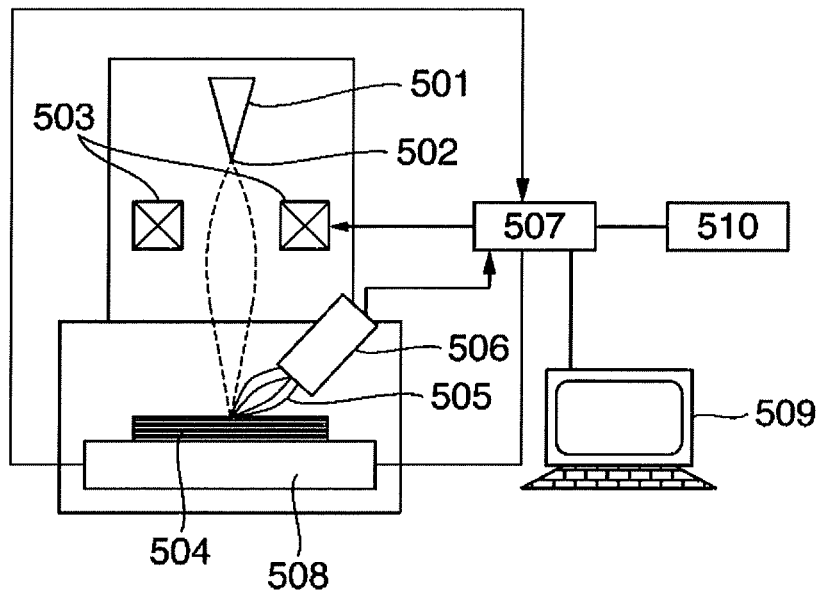
FIG. 5 is a diagram showing a general configuration of a scanning electron microscope.

The following describes the outline of a scanning electron microscope (Scanning Electron Microscope: SEM) that positions the field of view onto an area, which includes a measurement object pattern, via addressing. Although a SEM is used as an example of the image acquisition device in the embodiment below, another charged particle beam device such as a focused ion beam (Focused Ion Beam: FIB) device, which forms an image based on the signal obtained by scanning with the use of a focused ion beam, may also be used as the image acquisition device. FIG. 5 is a diagram showing an outline of a SEM. A charged particle beam (electron beam) 502 emitted from a charged particle source (electron gun) 501 is used for one-dimensional or two-dimensional scanning on a sample 504 by means of scanning coils 503.

A secondary particle (for example, secondary electron) 505 emitted from the sample 504 through the irradiation of the charged particle beam 502 is detected by a detector 506 and is input to a control device 507 (control processor), which has the arithmetic control function, as image data. Although a detector that directly detects the secondary electron emitted from the sample is shown as an example in this embodiment, a detector that detects a secondary electron, generated when the electron emitted from the sample collides with a secondary electron conversion electrode, may also be used. Because the charged particle beam 502 is focused by a focus lens, not shown, and a probe with an extremely small diameter is used for scanning, a high-resolution image can be formed.

The sample 504 can be moved in all three-dimension directions by an x-y-z stage 508. The control device 507 also controls the charged particle source (electron gun) 501, lens, detector 506, x-y-z stage 508, and an image display device 509.

In this example, the charged particle beam 502 is used to scan the sample 504 two-dimensionally (x-y direction) with the use of the scanning coils 503. The signal detected by the detector 506 is amplified by a signal amplifier included in the control device 507 and, then, transferred to the image memory for display on the image display device 509 as the sample image. The secondary signal detector may be a device that detects a secondary electron and a reflection electron or a device that detects a light or an X ray.

The address signal corresponding to a memory location in the image memory is generated in the control device 507 or in a separately installed computer and, after being converted to an analog signal, is supplied to the scanning coils. For example, when the image memory is composed of 512×512 pixels, the x-direction address signal is a digital signal that repeats the address from 0 to 512, and the y-direction address signal is a digital signal that is incremented by one when the x-direction address signal reaches 512 from 0 and then repeats 0 to 512. This digital signal is converted to an analog signal.

Because there is a correspondence between the addresses in the image memory and the addresses of the deflection signals used for electron beam scanning, the two-dimensional image in the electron beam deflection area, generated by the scanning coils, is recorded in the image memory. The signals in the image memory can be read sequentially on a time-series basis by the read-address generation circuit that operates in synchronization with the read clock. A signal that is read corresponding to an address is converted to an analog signal and is used as the brightness modulation signal in the image display device 509.

The control device 507, which functions as the image processor, has an input device, not shown, via which an image capturing condition (scanning speed, cumulative number of images) or a field of view correction method can be specified or the output or saving of an image can be specified.

The device described in this example has the function to form a line profile based on the detected secondary electron or the reflection electron. The line profile is formed based on the amount of electrons detected when the primary electron beam is used for one-dimensional or two-dimensional scanning or based on the brightness information on the sample image. The obtained line profile is used, for example, for measuring the size of a pattern formed on a semiconductor wafer.

Although the scanning electron microscope shown in FIG. 5 has a configuration, in which the control device 507 is integrated with the main body of the scanning electron microscope, or a similar configuration, the scanning electron microscope is not of course limited to that configuration. A control processor, provided separately from the main body of the scanning electron microscope, may also be used to perform the processing described below. In that case, a transmission medium that transmits the detection signal, detected by the secondary signal detector, to the control processor or transmits the signal from the control processor to the lens or the deflector of the scanning electron microscope, as well as an input/output terminal that sends or receives the signal transmitted via the transmission medium, is required.

In addition, the device in this example has the function that stores a condition, used for observing a plurality of points on a semiconductor wafer (size measurement positions, optical conditions for the scanning electron microscope, etc.), as a recipe in advance and performs size measurement or observation according to the contents of the recipe.

Furthermore, the program that performs the processing described below may be registered in a recording medium to allow the control processor, which supplies necessary signals to the scanning electron microscope, to execute the program. That is, the description of the example below is also the description of the program that can be used on a charged particle beam device such as a scanning electron microscope having an image processor or is the description of the program product.

In addition, a circuit design data management device 510, which stores design data on a pattern on a semiconductor wafer and converts the design data to the data necessary for SEM control, is connected to the control device 507. The circuit design data management device 510 has the function that creates a recipe for controlling the SEM based on the design data on a semiconductor pattern received from an input device not shown. The circuit design data management device 510 also has the function to rewrite a recipe based on the signal transmitted from the control device 507. Although separate from the control device 507 in the description of this embodiment, the circuit design data management device 510 is not limited to this configuration. The control device 507 and the circuit design data management device 510 may be configured as one integrated device.

In this embodiment, the sample 504 is a wafer created using the self-organizing technology in the semiconductor fabrication process. As one of the inputs used for creating a recipe used for evaluating the wafer, the semiconductor circuit design data corresponding to the pattern is used. The semiconductor circuit design data used in this case is a pattern shape formed on a photomask. Although the inspection object is a semiconductor wafer in the description below, any inspection object may be used as long as the object is a DSA technology based wafer. The circuit design data may have any format and type if the software that displays the circuit design data can display its format form and can treat the circuit design data as graphic data.

As a system for creating a measurement recipe from semiconductor circuit design data, a device is used that can set a measurement recipe from circuit design data, that can execute the measurement recipe on the CD-SEM, and that can obtain necessary measurement data.

Figure 18:
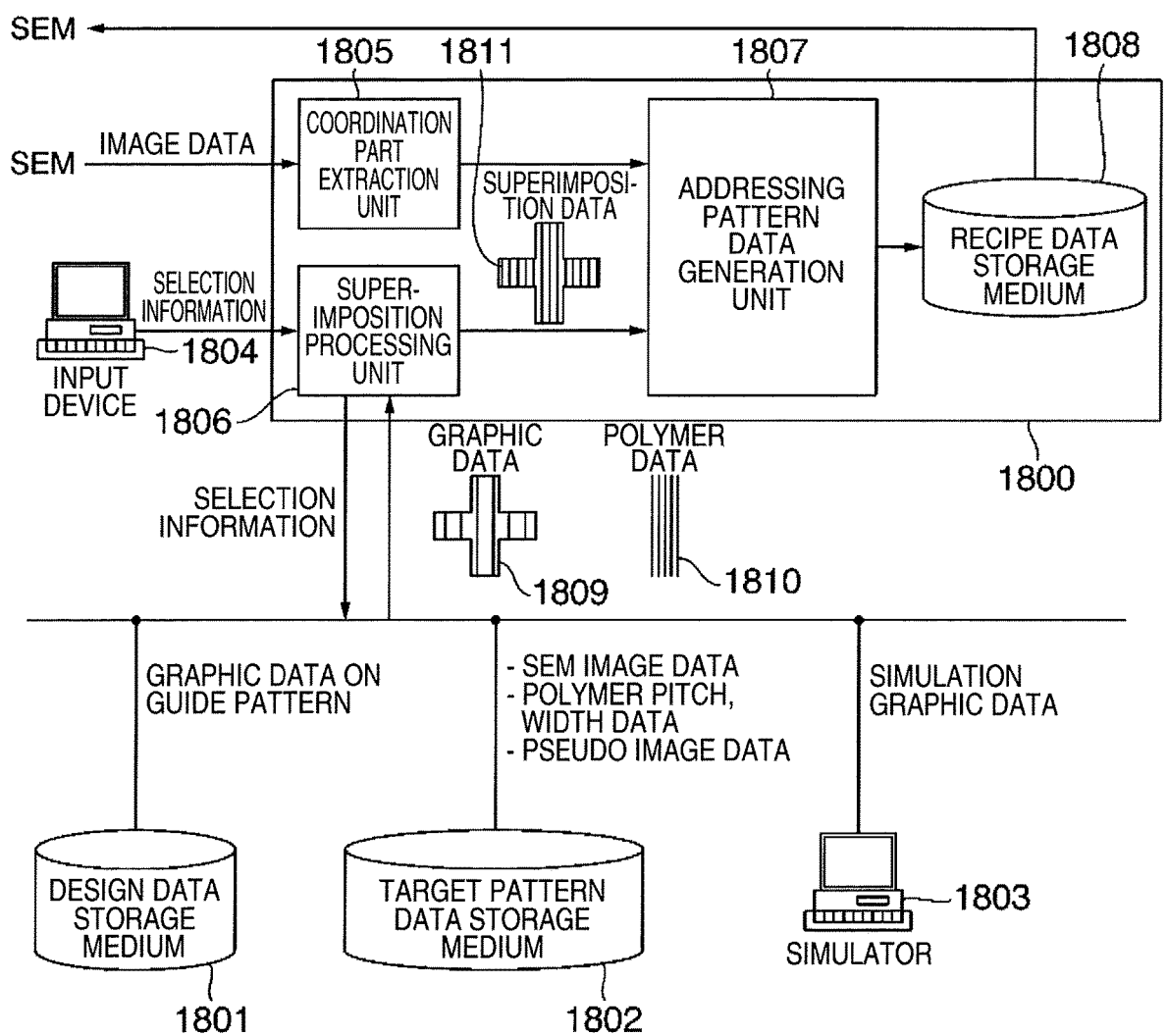
FIG. 18 is a diagram showing an example of a recipe creation system used to create a recipe for a SEM (Scanning Electron Microscope).
Figures 19, 20:
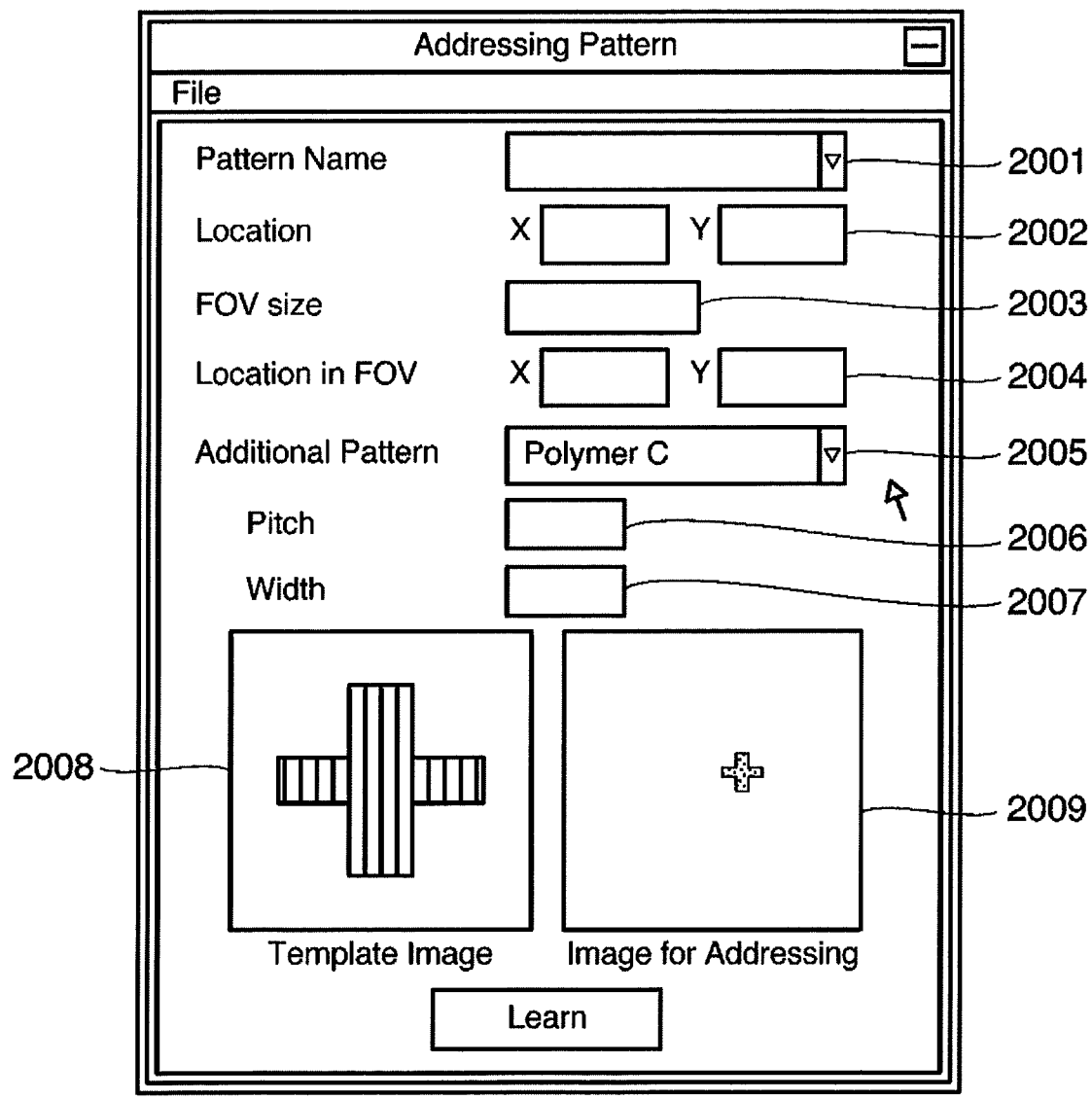
FIG. 19 is a diagram showing an example of a table in which a high molecular compound, a formed pattern pitch, and a width, which are associated with each other, are stored.
FIG. 20 is a diagram showing an example of a GUI (Graphical User Interface) screen for specifying a condition for forming an addressing pattern for use when a sample created using the DSA technology is measured.

FIG. 18 is a diagram showing an example of a recipe creation system that includes an image processor (arithmetic processing device) 1800 and recording media that store data for creating addressing pattern data. The image processor 1800 is connected to a SEM not shown and is connected to a design data storage medium 1801, a target pattern data storage medium 1802, and a simulator 1803, which simulates a pattern shape and so on based on design data, via a network. An input device 1804, from which an addressing pattern creation condition can be entered, is connected also to the image processor 1800. The design data storage medium 1801 stores graphic data on a guide pattern used for the DSA technology. This graphic data can be read based on selection information received from the input device 1804. It is also possible to cause the simulator 1803 to simulate the result of a pattern based on the graphic data on a guide pattern stored in the design data storage medium 1801 and to send the graphic data to the image processor 1800 as data on the guide pattern. In addition, the target pattern data storage medium 1802 stores SEM image data on high molecular compounds, the pitch width data on high molecular compounds, or pseudo image data on high molecular compounds. These data can be read based on an instruction on a high molecular compound, or based on an input of the pattern width or pitch of a high molecular compound, received from the input device 1804. FIG. 19 is a diagram showing a database in which the type of a high molecular compound and the pitch and width of the high molecular compound, which are associated with each other, are stored.

Based on these data, the image processor 1800 can form the pseudo image of a polymer formed with the same line width and pitch.

FIG. 20 is a diagram showing an example of the GUI (Graphical User Interface) screen displayed on the display device of the input device 1804. Based on a pattern name or a location entered from a pattern name input window 2001 and a pattern location input window 2002, the graphic data on an area, which includes a guide pattern, is read from the design data storage medium 1801 and the simulator 1803. The field of view size for addressing may be selected by selecting a field of view size from a field of view size setting window 2003 for setting the field of view size. Where in the field of view to locate the pattern for addressing may be selected by entering location information in a location in field of view selection window 2004.

The information on the type of a high molecular compound can be selected in an additional pattern selection window 2005. For example, based on a material selected in this window, the SEM image data, high molecular compound pitch and width data, or pseudo image data, which are stored in association with the material, can be read. In addition, using the image processor 1800, the pseudo image of a high molecular compound can be formed based on the numeric values entered in a pitch information input window 2006 and a pattern width input window 2007. The pseudo image of a high molecular compound may be formed by reading the brightness information allocated in advance to each high molecular compound and by arranging the brightness information according to the size of the address pattern to be created and the pitch information and pattern information that are set.

The image processor 1800 can store an addressing pattern, created based on the setting information, in a recipe storage medium 1808 as the SEM measurement recipe information.

Figure 21:
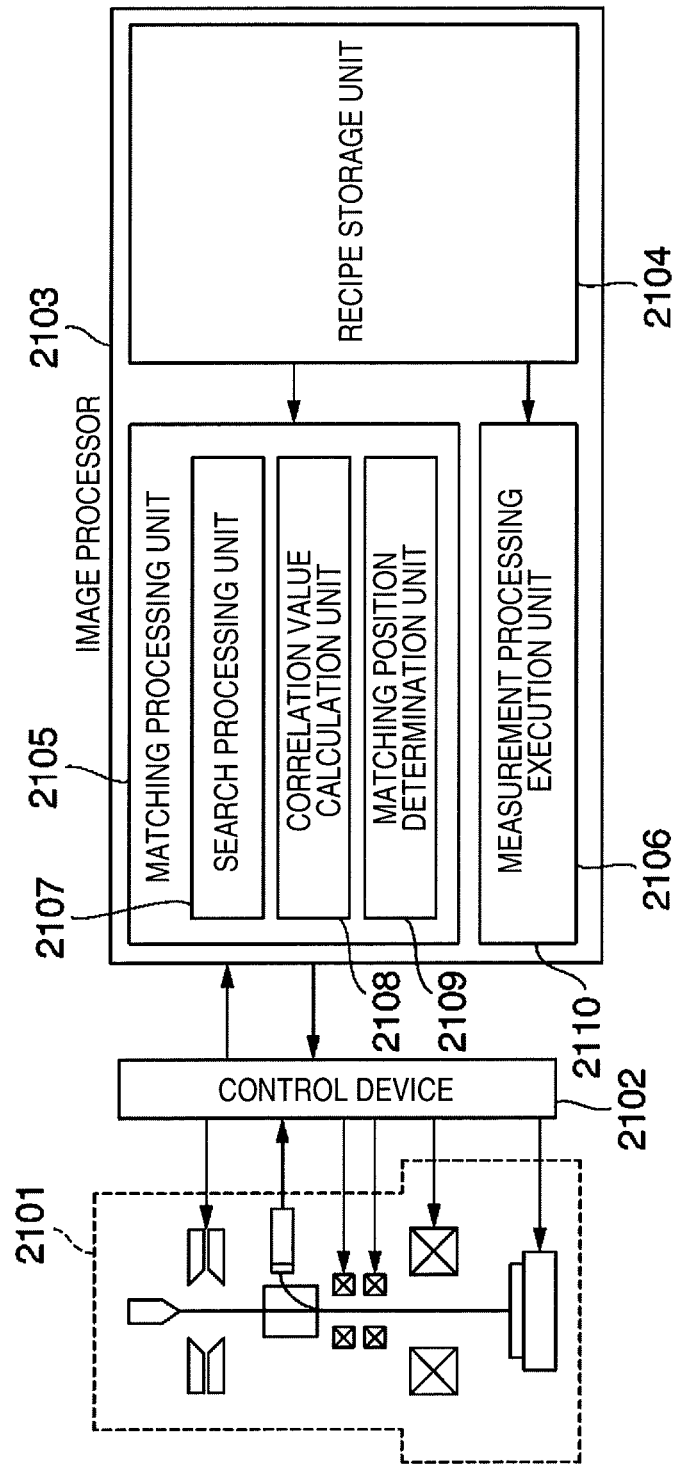
FIG. 21 is a diagram showing an example of a measurement or inspection system that measures or inspects a semiconductor device.

FIG. 21 is a diagram showing the detail of a measurement or inspection system that includes a SEM. This system includes a SEM main body 2101, a control device 2102 of the SEM main body, and an image processor 2103 that performs template matching and measurement processing. A recipe storage unit 2104, included in the image processor 2103, is for registering a recipe, created by the image processor 1800 shown in FIG. 18.

The image processor 2103 includes a matching processing unit 2105 that performs matching processing using a template in the image signals obtained via the control device 2102 and a measurement processing execution unit 2106 that locates the field of view onto the measurement position identified by the matching processing unit 2105, obtains the detection signal, creates a line profile based on the detection signal, and measures the size between peaks in the profile. A recipe, an operation program for automatically operating the SEM, is stored in a memory described above or in an external storage medium for each type of a sample to be measured, and is read as necessary. In addition, though not shown, image processing hardware, such as the CPU (Central Processing Unit), ASIC (Application Specific Integrated Circuit), and FPGA (Field Programmable Gate Array) included in the image processor 2103, is used to perform image processing according to the purpose.

It is also possible to allocate the whole or a part of the control and processing to an electronic computer, which has the CPU and a memory in which an image can be accumulated, for performing the processing and control. Template matching is a method for identifying a position, where a captured image to be located and a template match, based on the matching degree determination using normalized correlation. The matching processing unit 2105 identifies a desired position in a captured image based on the matching degree determination. Although the degree of matching between a template and an image is represented by the term "matching degree" or "similarity degree" in this embodiment, these two terms are equivalent in that they mean an index indicating a coincidence between the two. A mismatching degree or dissimilarity degree is one mode of a matching degree or similarity degree.

First Embodiment

The method for generating an addressing pattern based on a guide pattern, used for DSA, is described below. In this embodiment, an addressing pattern is created using a photomask that is created by arranging a guide pattern with the same size and pitch as those of a target pattern as shown in FIG. 1. More specifically, exposure is performed using a photomask created by arranging the pattern 103, which will become the guide pattern, at the same pitch in a pattern (for example, cross pattern) that will become an addressing pattern and, in addition, the BCP is applied and annealing is performed to form the pattern.

In addition, from an image generated by capturing the addressing pattern created as described above, a random pattern, which is present outside the addressing pattern, is removed to generate template image data for addressing.

The reason for generating an addressing pattern by preparing a guide pattern arranged at a pitch smaller than the whole size of the addressing pattern is as follows. Because an addressing pattern must capture an image with magnification lower (larger field of view) than that of a measurement object pattern for correcting the position of a radiated electron beam, the addressing pattern is usually formed in a size larger than that of the target pattern.

Figure 3:
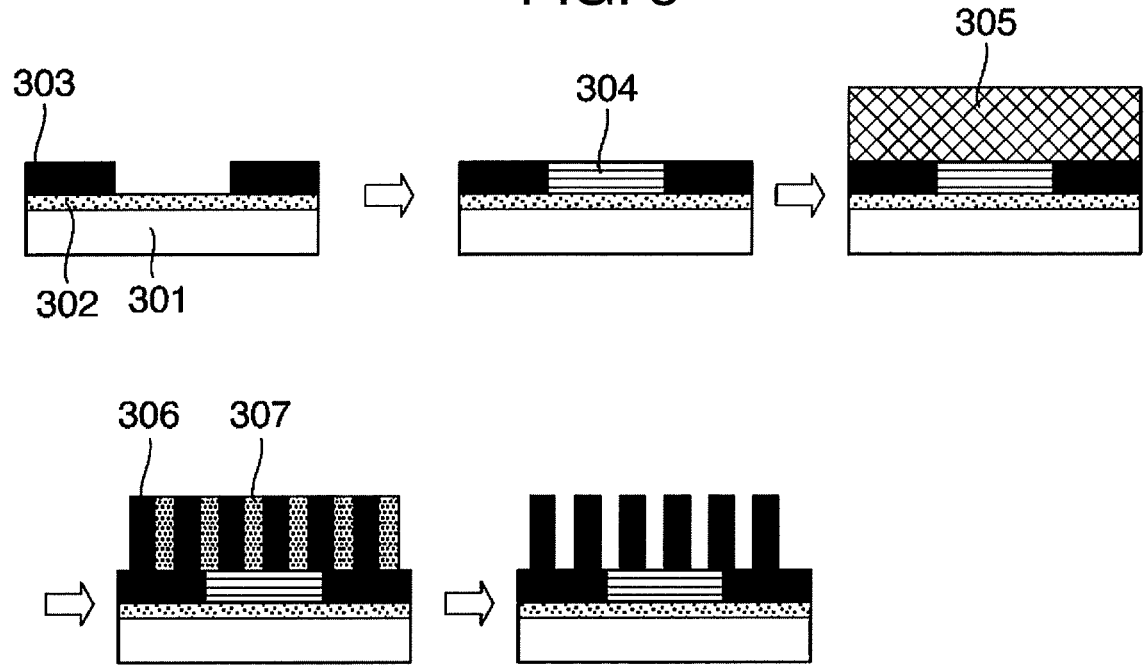
FIG. 3 is a diagram showing an example of a patterning process using the DSA technology (large distance between guide patterns).
Figure 4:
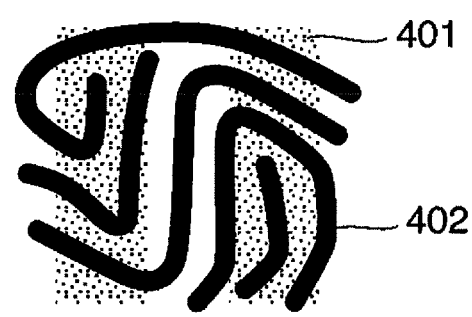
FIG. 4 is a diagram showing an example of a pattern formed via the patterning process using the DSA technology (large distance between guide patterns).

On the other hand, when a guide pattern used for DSA is formed in a large size, DSA-based pattern formation is not performed properly on a guide pattern as shown in FIG. 3. FIG. 4 is a top view of a pattern created using the process shown in FIG. 3. A guide pattern 401 is present in the lower layer of a target pattern 402. Although the size and the pitch of the pattern of the target pattern 402 are created as intended, its direction cannot be controlled with the result that the pattern is formed in random directions. Because the guide pattern 401 is present in the lower layer of the target pattern 402 and the target pattern 402 in the upper layer is formed in random directions, the contrast is decreased and it is sometimes difficult to use the pattern as an addressing pattern.

In this embodiment, the contrast of the addressing pattern can be maintained to fulfill its role by forming an addressing pattern using the guide of the same rule as that of a target pattern. Performing image processing for the pattern, formed in this way, eliminates the effect of a part uncontrollable by DSA, giving high position correction accuracy in addressing in the measurement sequence.

Figure 6:
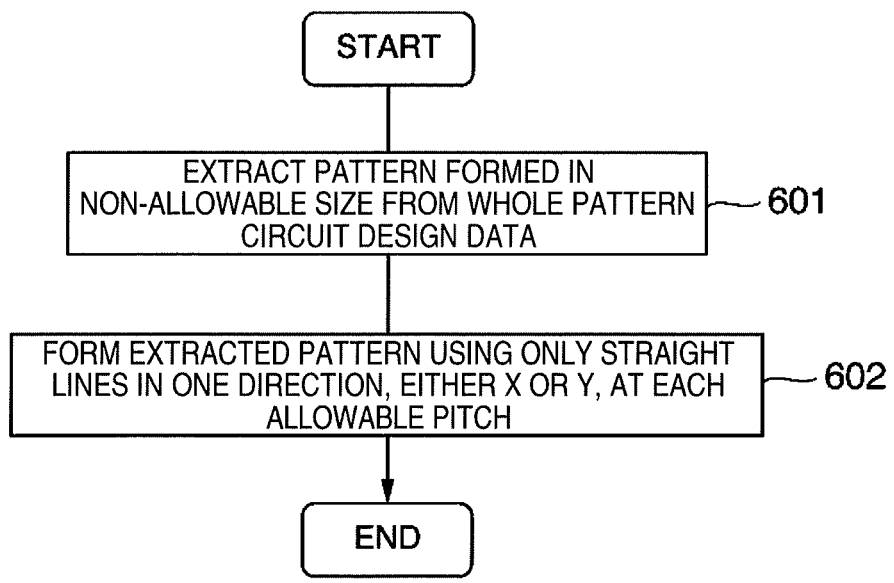
FIG. 6 is a flowchart showing the creation process of an addressing pattern.
Figure 7:
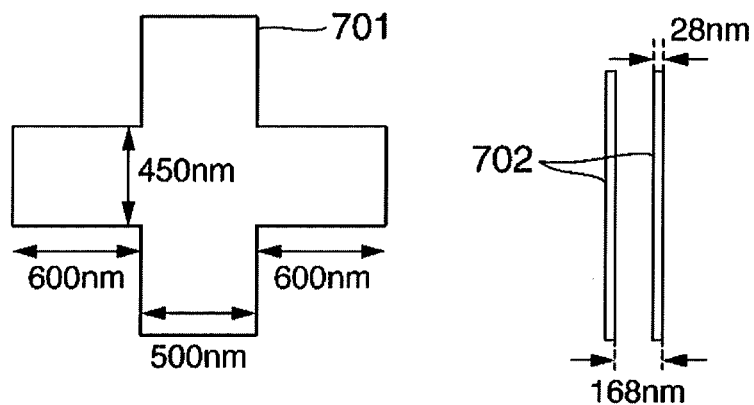
FIG. 7 is a diagram showing an example of pattern data used as the base of an addressing pattern.

The following describes an example in which a template image for addressing is created using a cross shaped pattern such as that shown in FIG. 7. FIG. 6 is a flowchart showing a part of the process. In this embodiment, as an object pattern for creating a template image, the circuit design data, configured by a cross-shaped pattern and two straight lines shown in FIG. 7, is used as an example. The pattern to be created is a pattern that is larger than the cross target pattern in size and is used as an addressing pattern in a CD-SEM measurement recipe. The actual sizes of the cross pattern are shown in the figure. In the DSA technology used in this example, the target size is 28 nm and the guide pattern is arranged at a pitch of 168 nm. The line width of each of the two straight lines is 28 nm that is the target size of the DSA and the two straight lines are arranged at a pitch of 168 nm. In this case, it is determined in step 601 that the cross pattern does not satisfy the DSA allowable size and that the two straight lines satisfy the DSA allowable size and therefore they are accepted.

Figure 8:
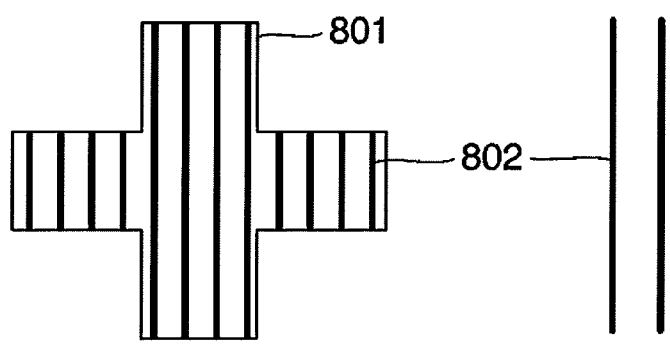
FIG. 8 is a diagram showing an example in which a guide pattern is arranged in an addressing pattern.

Next, in step 602, the pattern is arranged in such a way that the cross pattern is configured only by the straight pattern. Although the straight line is a vertical line, a horizontal line may also be used. FIG. 8 is a diagram showing an actual example in which the 28 nm patterns are arranged in the cross pattern in FIG. 7 at a pitch of 168 nm.

In this case, the guide pattern is arranged at the right end of the cross pattern and, in such a case, the guide pattern is not arranged at the pattern ends other than the right end. When arranging the guide pattern, the guide pattern is not arranged outside the original pattern area. The reason is that there is a need to avoid the possibility of overlapping that may occur when the guide patterns of the patterns, adjacent to each other at a suitable interval, are arranged. Each of the two straight lines, originally created according to the DSA allowable size, is used directly as a guide pattern 802.

Figure 9:
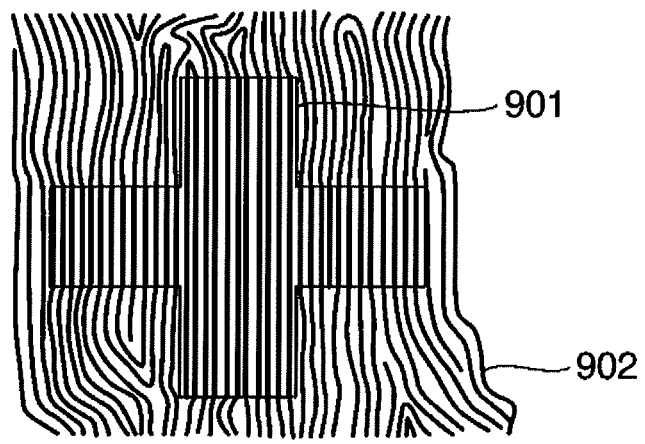
FIG. 9 is a diagram showing an example in which a pattern is arranged in an addressing pattern through annealing.

In general, a DSA pattern in a part, where there is no guide pattern, has a fingerprint-like pattern the direction of which is uncontrollable. Therefore, when a DSA pattern is formed in the state in which there is no guide pattern, for example, at the end of the pattern in FIG. 8, a fingerprint-like random pattern 902 is formed in the area outside the guide pattern at the ends of the cross pattern on the wafer, as shown in FIG. 9.

To use the pattern, created in this way, as an addressing pattern in the measurement recipe of a CD-SEM, it is necessary to perform image processing for the captured SEM image and, after that, to save the image in the measurement recipe as an image template with the surrounding fingerprint-like pattern removed as an image.

Figure 10:
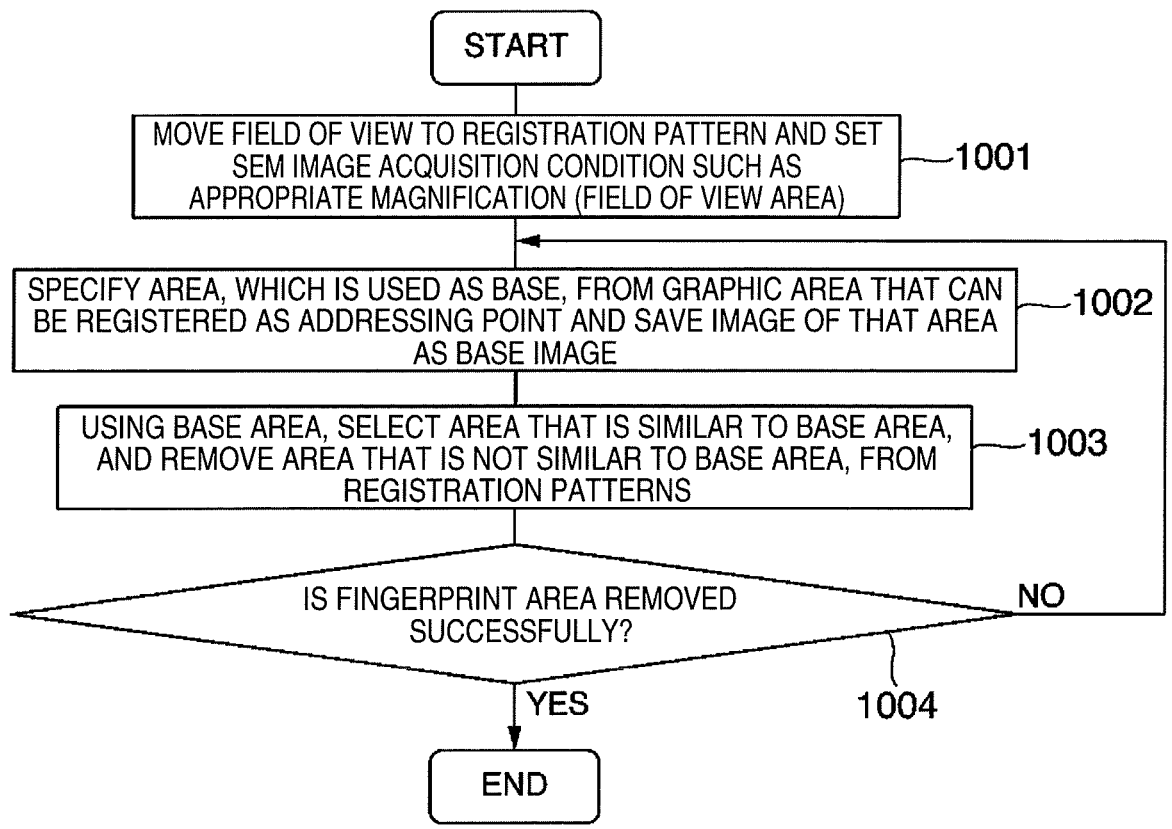
FIG. 10 is a flowchart showing a process for creating an addressing pattern by removing a random pattern.

FIG. 10 shows the image template registration flow for registering the image template. In step 1001, the field of view is moved to the pattern used for addressing and, with the SEM image displayed, the magnification (field of view area), the accelerating voltage of electron beam (attainment energy of electron beam), the probe current, and number of frames condition are selected. In this example, the magnification is set so that the field of view is a square area having the side length of 450 nm, and the accelerating voltage is set to 800V, the probe current is set to 8 pA, and the cumulative number of frame is set to 16.

Next, in step 1002, an area including a pattern, which will be used as the addressing pattern, is specified, and the image of the area is registered as the base image. This base image becomes a template image through the processing that will be described later. In step 1003, annealing is performed to remove a random pattern positioned in an area other than the self-organizing area. The reason for removing a random pattern is as follows.

The CD-SEM is used to perform fixed-point measurement of a particular pattern of a plurality of samples created under the same fabrication condition, especially, in the mass production process of semiconductor devices. However, even under the same fabrication condition, the shape of a random pattern varies according to the sample. That is, if a template is created with a random pattern included, the degree of matching between the template and a particular area, for which template matching is performed, is decreased. This embodiment, in which a template is created by removing a random pattern that will result in a decrease in the matching degree, can reduce the possibility of matching error generation.

Figure 11:
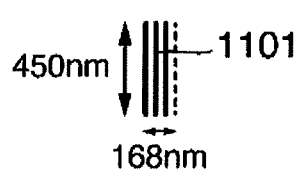
FIG. 11 is a diagram showing an example of a template for selectively extracting an aligned part after annealing.

Another possible method for removing a random pattern is to selectively extract a pattern part that is aligned through self-organization and then to remove a part that is not extracted. A coordination part extraction unit 1805 of the image processor 1800 shown in FIG. 18 identifies an aligned part and a non-aligned part using the template of an aligned part that is registered in advance. To perform this processing, the base image (template) and an image to be evaluated are required and, in this example of the cross pattern, the shortest segment in the vertical direction, in which a straight line is formed, is used. In the pattern shown in FIG. 7, the segment with a length of 450 nm is used. The line width of the straight line is 28 nm that is the target size in the DSA technology used in this example. In addition, because the pitch used in the guide pattern of the self-organizing technology in this example is 168 nm, three periods, each composed of the 28 nm line part and the 28 nm space part, are selected as one unit at image registration time. FIG. 11 is a diagram showing an example of a template for extracting an aligned pattern. The correlation value arithmetic processing, which uses a template such as that shown in FIG. 11, is performed for the SEM image such as that shown in FIG. 9 to selectively extract a part where the correlation value is equal to or larger than the predetermined value (or to remove the other part). To increase the extraction accuracy, not only the value of correlation between the template and the image but also the determination of whether a part, where the correlation value exceeds the predetermined value, forms a predetermined shape may also be included.

At this time, the size of the cross pattern itself becomes smaller than the original size that is set in FIG. 7. However, because the purpose of the addressing pattern is to match positions, the relative position remains the same and therefore no problem is generated if both the size of the template image and the size of the pattern on the wafer change in the same manner.

In step 1004, whether the fingerprint-like pattern surrounding the addressing pattern is successfully removed is confirmed either visually or using a determination algorithm for automatically determining the pattern shape. If the removal cannot be confirmed successfully, the surrounding pattern can be removed successfully in some cases by changing the specification of the base pattern area specified in step 1002.

Figure 12:
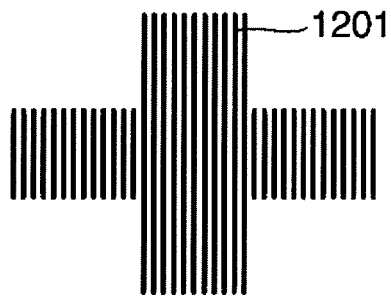
FIG. 12 is a diagram showing an example of an addressing pattern after a random pattern is removed.

The processing described above allows the template, in which the aligned part is selectively extracted as shown in FIG. 12, to be created. The image data extracted by the coordination part extraction unit 1805, to which the predetermined information required to register a condition as a recipe is added by an addressing pattern data generation unit 1807, is registered in the recipe data storage medium 1808. The template shown in FIG. 12 has the shape of a cross-shaped guide pattern, and this image data is stored as the template.

Figure 13:
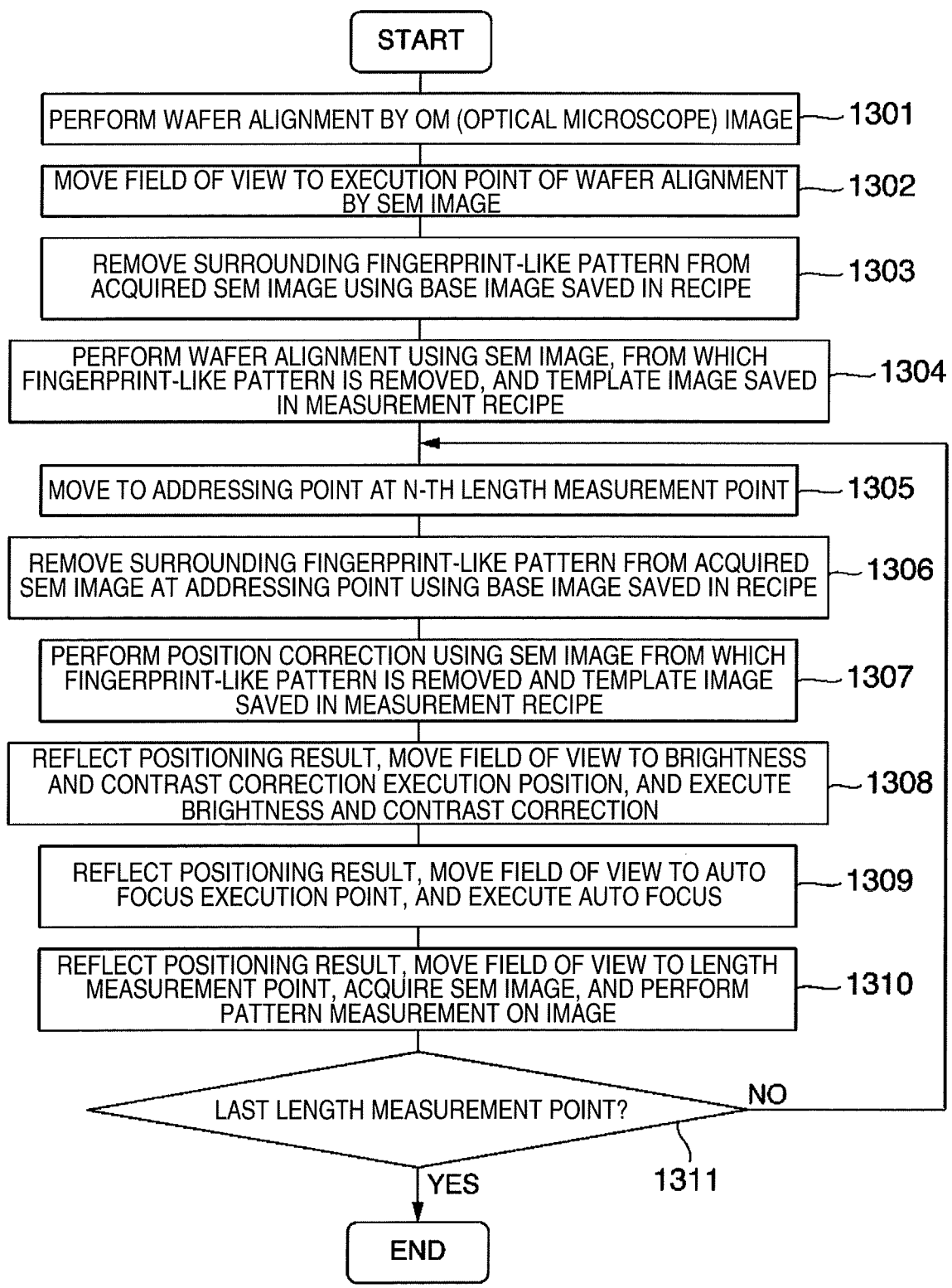
FIG. 13 is a flowchart showing the creation process of an addressing pattern and the measurement process using the created addressing pattern.

Next, with reference to the flowchart shown in FIG. 13, the following describes the process of measurement on the SEM that is performed by the image processor 2103, shown in FIG. 21, by executing a recipe stored in the recipe data storage medium 1808.

A measurement object pattern is created using the self-organizing technology, and there is a pattern with a size larger than the target size. This pattern is configured only by an allowable pattern created through the process such as that described above. When a CD-SEM measurement recipe is executed, a wafer is loaded into the device, the condition to be used is set and, after that, wafer alignment is performed first to position the wafer. This wafer alignment is performed in two stages: one is alignment by means of an optical microscope image (step 1301) and the other by means of a SEM image (step 1302).

Alignment by means of an optical microscope image is not affected much by the presence of a random pattern. On the other hand, alignment by means of a SEM image requires the usual procedure as well as the procedure for removing a fingerprint-like pattern generated by the DDA technology. The reason is that alignment by means of a SEM image requires that the similar position correction be performed at different exposure positions on a wafer 1401 as shown by a chip 1403 (FIG. 14).

However, when creating a pattern using the DSA technology, there is no problem with a pattern the direction of which is controlled by a guide pattern. However, in an area where there is no guide pattern and the direction cannot be controlled, the so-called fingerprint-like pattern is randomly formed with the result that not all three images used for SEM image alignment are the similar. To address this problem, the surrounding fingerprint-like, randomly shaped pattern is removed when SEM alignment is performed (step 1303) to select a pattern intended for use in SEM alignment. This makes the three SEM images similar to that shown in FIG. 12, allowing positioning to be performed using these images (step 1304).

After wafer alignment is performed, the field of view is moved to a position registered as the length measurement point (step 1305) and addressing is performed. Also when this addressing is performed, the fingerprint-like pattern around the pattern must be removed (step 1306) before performing addressing. The reason is that the exposure shot, used at measurement recipe registration time, and the exposure shot, used for actual measurement, are sometimes different shots and, in that case, the patterns are not exactly similar because the pattern, for which addressing is performed, is a pattern around which there is a fingerprint-like pattern the direction of which is random.

The subsequent sequence includes the step for performing position correction using the registered template (step 1307), the step for setting the brightness and contrast of the length measurement point (step 1308), the step for performing auto-focus (step 1309), and the step for moving the field of view to the length measurement point, for acquiring the SEM image, and for performing measurement (step 1310).

After measurement, the processing moves to the next length measurement point to perform length measurement using the same sequence. Using this method allows addressing to be performed suitably even for a pattern formed based on DSA, thus enabling length measurement to be performed using a measurement recipe.

Second Embodiment

When creating a measurement recipe in the first embodiment, an image template to be saved in the measurement recipe is registered by observing an accrual wafer, while, when creating a measurement recipe in this embodiment, an image template to be registered is created based on circuit design data. Although the circuit design data used at this time is data used when the photomask is created, the size of the whole data is reduced to ¼ in order to establish correspondence with the pattern on the wafer. This is because a ¼ reduction projection type exposure device is used in this embodiment when exposure is performed for the guide pattern.

The circuit design data used this time does not include a pattern that is formed using a size other than the target size of the DSA technology. As shown in FIG. 8, the line pattern with the target size is arranged at a specified periodic interval.

This circuit design data is stored in the design data storage medium 1801 and is captured into the image processor 1800 based on selection information entered from the input device 1804. The information not included in the design data is acquired by capturing the information other than the usual design data stored in the target pattern data storage medium 1802 or by capturing the input information entered from the input device 1804. For example, the information not included in the design data is information on the target pattern size, guide pattern pitch, target pattern pitch, and base pattern period. These information is received as addition information. In this embodiment, to create a template equivalent to the template created in the first embodiment, the target pattern size is set to 28 nm, the guide pattern pitch is set to 168 nm, the target pattern pitch is set to 1:1, and the base pattern period is set to 1. FIG. 15 is a diagram showing design data 1501 in which the guide pattern is formed in the cross-shaped addressing pattern data and superimposition data 1502 obtained by adding additional information to the design data 1501.

As described above, in the pattering according to DSA, a new pattern is arranged between the guide patterns arranged in advance. In this case, the target pattern with the size of 28 nm is formed at a pitch of 168 nm with the ratio between the line part and the space part being 1:1. The base pattern period is the same as the period in the template that is used for removing a fingerprint-like pattern before performing addressing when the measurement recipe, which is set, is executed on the CD-SEM.

Because the base pattern period is set to 1 in this embodiment, the base area has the size equivalent to one period, that is, 168 nm, in the direction perpendicular to the line pattern and the size equal to that of the shortest part of the cross pattern as in FIG. 11, that is 450 nm, in the direction of the line pattern. That is, the line and the space, each in 28 nm in width, are formed at a ratio of 1:1, and the area surrounded by the lines, 168 nm and 450 nm in size, is the base area in this embodiment. This embodiment is different from the first embodiment in that the area shown in FIG. 11 is an area selected by the user from an actual pattern on a wafer while the area in this embodiment is set automatically by the system based on the parameters.

Figures 17A, 17B:
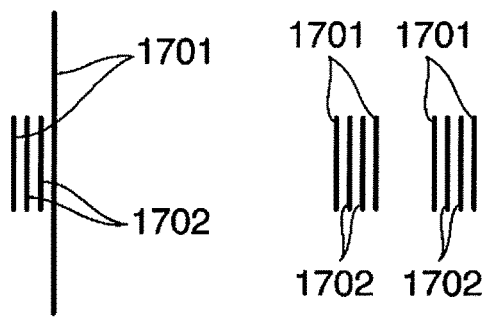
FIGS. 17A and 17B are diagrams showing an example in which a DSA-formed pattern is changed according to the arrangement condition of a guide pattern.

When the lengths of neighboring guide patterns differ from each other, the areas are classified into types, one is an area in which a pattern is arranged and the other is an area in which a pattern is not arranged, according to whether there is a neighboring guide pattern. In the case of FIG. 16A, guide patterns 1601, different in length, are arranged at the guide pattern pitch of 168 nm. Because there is a guide pattern at both ends of the area of a guide pattern pitch 1602, a pattern is arranged in this area. On the other hand, because there is a guide pattern only at one end of an area 1603, a pattern is not formed in this area. In the case of FIG. 16B, because there is a guide pattern at both ends of an area 1604 but the interval is not equal to the guide pattern pitch that is set by the parameters described above, a pattern is not formed in this area. A pattern is formed when there is a guide pattern at both ends of an area and its interval is equal to the guide pitch. The figure is a figure showing the pattern shape obtained by performing annealing for the sample shown in FIG. 16A and FIG. 16B and is a figure showing the figure in which a pattern 1702 is arranged in an area where there is a guide pattern 1701 at both ends. As shown in FIG. 17B, when the distance between the guide patterns is large, a pattern is not arranged.

As described above, the information different from circuit design data, composed only of guide patterns, is stored in the target pattern data storage medium 1802 and is read as necessary, or such information is set via the input device 1804, to enable an addressing pattern, similar to the actual image, to be generated.

The addressing pattern data generation unit 1807 creates a measurement recipe by adding information, necessary for automatic measurement such as the information on an addressing point, auto focus point, and brightness and contrast algorithm for use in the sequence of the measurement recipe, to the superimposition data formed by adding additional information to the design data (simulation data) that is formed as described above. Then, the addressing pattern data generation unit 1807 stores the created measurement recipe in the recipe data storage medium 1808.

It is desirable that the data shown in FIG. 7 be used as the circuit design data rather than the pattern shown in FIG. 17A and FIG. 17B where a DSA target pattern is arranged or the pattern 1501 shown in FIG. 15 where a guide pattern is arranged. The reason is that a large-sized pattern must be arranged as a large pattern when the method used for automatic setting is directly used.

The GUI screen shown in FIG. 20 has a display area 2008 in which a template image being created is displayed and a display are 2009 in which a low-magnification image for addressing is displayed. These display areas allows a recipe creator to confirm the suitability of an addressing pattern while visually confirming these display areas.

Although the present invention has been described with reference to embodiments thereof, it will be obvious to those skilled in the art that various changes and modifications may be made without departing from the spirit or scope of the present invention.

REFERENCE SIGNS LIST

501 Charged particle source
502 Charged particle beam
503 Scanning coil
504 Sample
505 Secondary particle
506 Detector
507 Control device
508 Stage
509 Image display device
510 Circuit design data management unit

The invention claimed is:

1. A computer-implemented method of generating a template used for template matching using image processing, the method comprising:
   receiving image data including a self-organized pattern in a guide pattern used for a self-organized lithography by an annealing process and a fingerprint pattern;
   removing the fingerprint pattern from the image data by the image processing; and
   storing the image data from which the fingerprint pattern has been removed as the template in a memory.

2. The computer-implemented method of claim 1, wherein the removing of the fingerprint pattern from the image data by the image processing comprises: extracting the self-organized pattern from the image data by executing pattern matching using a template indicating a self-organized pattern.

* * * * *